United States Patent [19]
Hartsell

[11] 3,946,420
[45] Mar. 23, 1976

[54] TWO LEVEL ELECTRODE CONFIGURATION FOR THREE PHASE CHARGE COUPLED DEVICE

[75] Inventor: Glenn A. Hartsell, Dallas, Tex.

[73] Assignee: Texas Instruments Incorporated, Dallas, Tex.

[22] Filed: June 28, 1974

[21] Appl. No.: 483,993

[52] U.S. Cl. ................................. 357/24; 357/68
[51] Int. Cl.² ................. H01L 29/78; H01L 23/48
[58] Field of Search ............................. 357/24, 68

[56] References Cited
UNITED STATES PATENTS

| | | |
|---|---|---|
| 3,795,847 | 3/1974 | Engeler et al. ........................ 357/24 |
| 3,859,717 | 1/1975 | Green et al. ........................... 357/24 |

Primary Examiner—Martin H. Edlow
Assistant Examiner—E. Wojciechowicz
Attorney, Agent, or Firm—Harold Levine; James T. Comfort; Richard L. Donaldson

[57] ABSTRACT

The specification discloses an electrode configuration for a three phase charge coupled device having a channel for accommodating movement of charge packets. A first phase bus is formed on two levels and is disposed along one side of the channel and includes an array of first phase electrodes which span the channel on two levels. Second and third phase busses are disposed along the other side of the channel and include arrays of second and third phase electrodes formed on two levels which span the channel and which extend between adjacent ones of the first phase electrodes.

10 Claims, 8 Drawing Figures

TWO LEVEL ELECTRODE CONFIGURATION FOR THREE PHASE CHARGE COUPLED DEVICE

This invention relates to charge coupled devices and more particularly relates to a two level electrode configuration for a three phase charge coupled device.

Charge coupled devices (CCD) are well known, and generally comprise a channel defined in a semiconductor layer, with a plurality of clock or phase electrodes being formed across the channel. Upon proper application of clock signals to the electrodes, charge packets are moved along the channel to provide a shift register function.

Charge coupled devices are commonly formed with two, three or four phase electrodes per bit. Of these configurations, the three phase CCD is often preferred, but problems have heretofore arisen in the electrode configuration for the three phase CCD. While two or four phase CCDs are easily formed with a two layer metallization technique due to the even number of electrodes per bit, three phase CCDs have often required an excessive number of interlevel connections in a two level metallization scheme. A need has thus arisen for a practical two level metallization technique for forming phase electrodes for a three phase CCD, without the requirement of excessive interlevel connections or complicated processing steps.

In accordance with the present invention, a three phase charge coupled device having a channel for movement of charge packets includes an array of first phase electrodes spanning the channel from one side of the channel. Arrays of second and third phase electrodes are formed on two levels and span the channel from the other side of the channels. Busses apply three phase clock signals to the phase electrodes.

In accordance with another aspect of the invention, an electrode configuration for a charge coupled device having a channel defined in a semiconductor body for movement therethrough of charge packets includes a first phase bus disposed along one side of the channel and having first spaced apart phase electrodes extending across the channel. A second phase bus is disposed along the other side of the channel and includes second spaced apart phase electrodes extending across the channel between the first phase electrodes. A third phase bus is disposed along the other side of the channel and is interleaved over and under ones of the second phase electrodes and includes third phase electrodes extending across the channel between ones of the first phase electrodes.

In accordance with yet a more specific aspect of the invention, a two level electrode configuration for a three phase charge coupled device register having a channel for movement of charge packets includes a first phase bus extending along one side of the channel on upper and lower levels. A dual layered series of first phase electrodes extends from the first phase bus across the channel, with odd numbered electrodes disposed on one level and even numbered electrodes disposed on the other level. A second phase bus extends along the other side of the channel on upper and lower levels. A dual layered series of second phase electrodes extends from the second phase bus across the channel between the first electrodes, with even numbered electrodes disposed on one level and odd numbered electrodes disposed on the other level. A third phase bus extends along the other side of the channel and is interleaved over and under alternate ones of the second phase electrodes. A dual layered series of third phase electrodes extends from the third phase bus across the channel between the first electrodes.

For a more complete understanding of the present invention and for further objects and advantages thereof, reference is now made to the following description taken in conjunction with the accompanying drawings, in which.

Referring now to FIGS. 1–7, a CCD register embodying the present invention includes a semiconductor body 10 having a channel 12 defined therein by conventional techniques through which charge packets are to be transferred under the control of three phase voltage pulses applied to phase electrodes. Although only one channel 12 is illustrated, it will be understood that in many embodiments a plurality of parallel channels will be placed side by side, with the phase electrodes spanning all of the channels. As an example of the construction of the channel 12, a semiconductor P-type body may be normally boron doped and then diffused along parallel strips with P+ boron in order to change the threshold level and thereby define the boundaries of channel 12.

Figure 1:
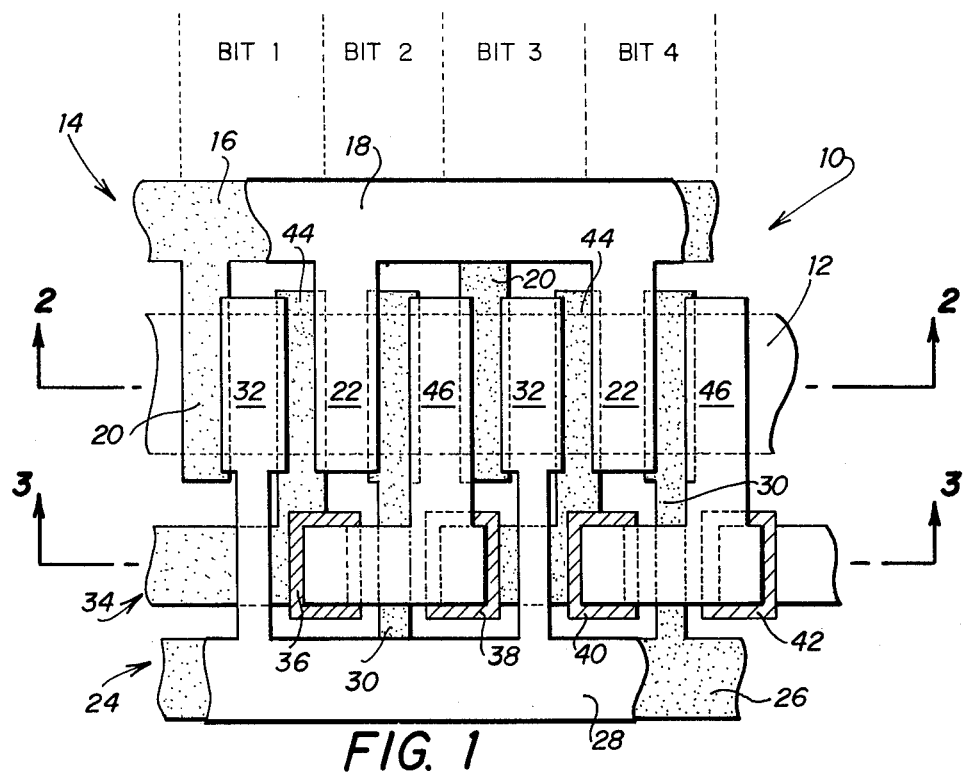
FIG. 1 is a top view of a CCD register embodying the electrode configuration of the present invention for a two layer three phase CCD.

Referring to FIG. 1, a first clock phase bus 14 is parallel to one side of the channel 12 and is comprised of a lower level bus 16 and an upper level bus 18. Phase electrodes 20 extend from bus 16 on the lower level, while phase electrodes 22 extend from the bus 18 on the upper level. Busses 16 and 18 may be separated by a layer of insulation and interconnected at the ends thereof, or alternatively busses 16 and 18 may electrically contact with one another along the length thereof. Thus, busses 16 and 18 electrically comprise a single phase bus and phase electrodes 20 and 22 comprise a first array of phase electrodes which extend over the channel 12.

A second phase bus 24 is disposed parallel to the other side of the channel opposite bus 14 and includes a lower level bus 26 and an upper level bus 28. Busses 26 and 28 are electrically connected. A set of phase electrodes 30 extend from the lower level bus 26 across the channel 12. A set of phase electrodes 32 extend from the upper level bus 28 across the channel 12. Inasmuch as busses 26 and 28 are electrically connected, phase electrodes 30 and 32 comprise a second array of spaced apart phase electrodes which extend across the channel 12. Phase electrodes 30 and 32 are provided with a cul-de-sac configuration due to the narrow neck portions 31.

A third clock phase bus 34 extends parallel to bus 24 and is interleaved under and over phase electrodes 30 and 32. For example, referring to FIG. 1, bus 34 is initially disposed on the lower metallization layer and extends under phase electrodes 32. Bus 34 then extends vertically through a via hole 36 defined through the insulation layer separating the upper and lower metallization layers. The third phase bus 34 then extends over the phase electrode 30 and extends vertically through a via hole 38 to the lower metallization layer. In a similar manner, the phase bus 34 extends under phase electrode 32, through a via hole 40 over phase electrode 30 and through a via hole 42 to the lower level.

In this manner, the third clock phase bus 34 is interleaved over and under the phase electrodes of the second phase bus 24. Phase electrodes 44 extend from the third phase bus 34 on the lower level, while phase electrodes 46 extend from the bus 34 on the upper metallization layer. Phase electrodes 44 and 46 are electrically connected in order to form a third set of phase electrodes which extend over the channel 12.

As shown in FIG. 1, the odd numbered phase electrodes 20 are connected on the lower metallization layer, while the even numbered phase electrodes 22 are connected on the upper layer metallization. Similarly, the odd numbered phase electrodes 32 are connected on a upper metallization layer, while the even numbered phase electrodes 30 are connected on the lower metallization layer. With respect to the third phase bus, the odd numbered phase electrodes 44 are disposed on the lower metallization layer, while the even numbered phase electrodes 46 are connected on the upper metallization layer.

It will thus be seen that phase electrodes from each of the three clock busses are adjacently disposed in patterns or sets over the channel 12. The first set comprises a phase electrode 20 from the first clock bus 14, the phase electrode 32 from the second clock bus 24 and the phase electrode 44 from the third clock bus 34, which are disposed over the bit 1 region of the channel 12. Phase electrodes 22, 30 and 46 are next adjacently disposed over the channel 12 to form the bit 2 region. Similar sequences of the phase electrodes are disposed over the channel 12 to form bits 3 and 4, as illustrated in FIG. 1. While it will be understood that dimensions will vary according to desired device parameters, typical dimensions of the present device include a spacing between adjacent electrodes of approximately 0.2 mils and electrode widths of 0.3–0.4 mils.

Figure 2:
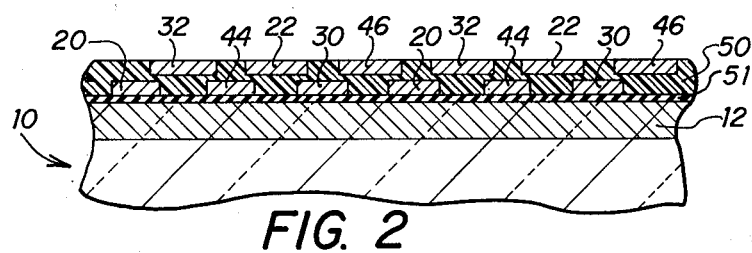
FIG. 2 is a sectional view of the configuration of FIG. 1 taken generally along the section lines 2—2.

FIG. 2 is a cross section of the device shown in FIG. 1 taken generally along the section lines 2—2, and illustrates the semiconductor body 10 and the channel 12. Phase electrodes 20, 44 and 30 are adjacently disposed in sets on the lower metal layer. Phase electrodes 32, 22 and 46 are disposed in adjacent sets on the upper metallization layer, as previously described. In the embodiment illustrated in FIG. 2, the upper and lower metallization layers are separated by an insulation layer 50, which may comprise for example silicon oxide. Electrodes 20, 44 and 30 are separated from the channel 12 by an insulation layer 51.

Figure 3:
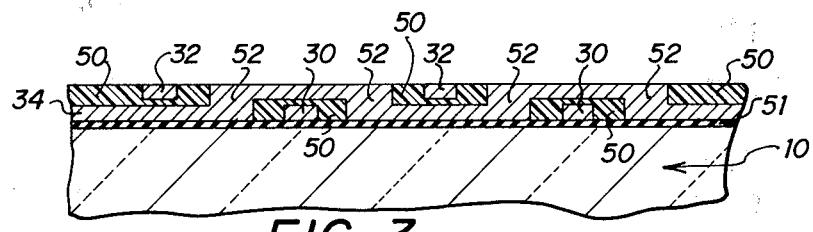
FIG. 3 is a sectional view of the device shown in FIG. 1 taken generally along the section lines 3—3.

FIG. 3 is a sectional view taken generally along section lines 3—3 in the device shown in FIG. 1. FIG. 3 clearly illustrates the third phase bus 34 which extends under phase electrodes 32 and over phase electrodes 30 as previously described. FIG. 3 illustrates the vertical sections 52 of phase bus 34 which extend through the via holes 36, 38, 40 and 42.

FIGS. 4–7 are useful in illustrating the fabrication techniques of the present invention. Initially, a silicon substrate is diffused with P+ material to define the channel 12. N-type diffusions are then provided at the ends of the channel, not shown, in order to form I/O diodes conventionally used to input and output signals from a CCD. A layer of insulation 51 is then conventionally thermally grown over the substrate and apertures are etched through the insulation to enable formation of metal contacts for the diodes.

Figure 4:
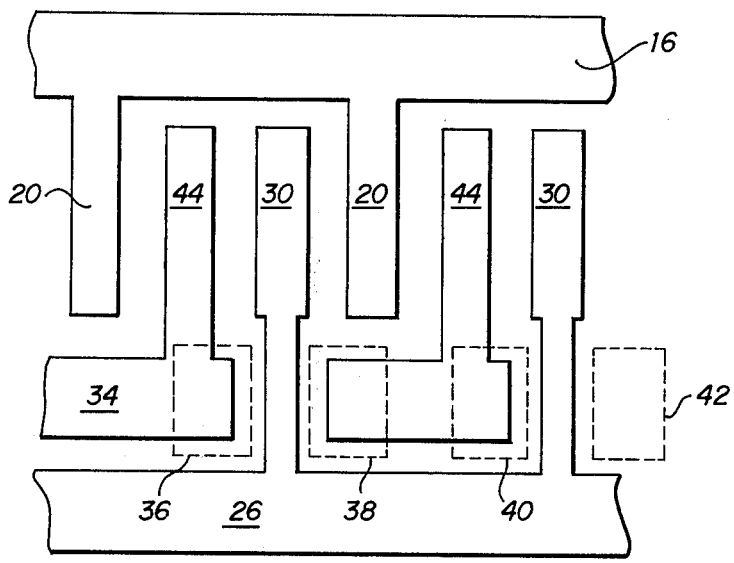
FIG. 4 is a top view of the first metallization layer of the device shown in FIG. 1.

A layer of metal is then formed by evaporation or the like over the insulation layer 51 and the pattern illustrated in FIG. 4 is then etched out to form the lower metallization layer. As may be seen, the electrode configuration of FIG. 4 includes the lower level phase one clock bus 16 and the lower level phase electrodes 20. The electrode configuration also includes the lower level second clock bus 26 and phase electrodes 30. One-half of the third clock bus 34 is then formed in the manner illustrated, along with phase electrodes 44. A layer of insulation is then provided over the first metallization layer, with via holes 36, 38, 40 and 42 being formed through the layer of insulation.

Figure 5:
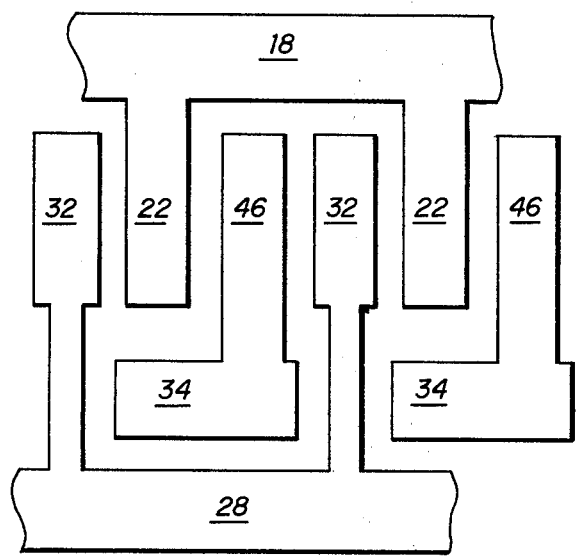
FIG. 5 is a top view of the second metallization layer of the device shown in FIG. 1.

Referring to FIG. 5, a second layer of metal is then deposited over the insulation layer and the electrode configuration shown in FIG. 5 is etched. As previously noted, the second metallization layer includes the upper clock bus 18 and phase electrodes 22, the second clock bus 28 and phase electrodes 32, along with the upper portions of the phase bus 34 and phase electrodes 46. The upper portions of the third phase bus 34 are joined through the via holes to the lower metallization layer. A protection layer such as nitride is then provided over the device for handling protection and the like, with apertures being left for bonding pads in the conventional manner.

Figure 6:
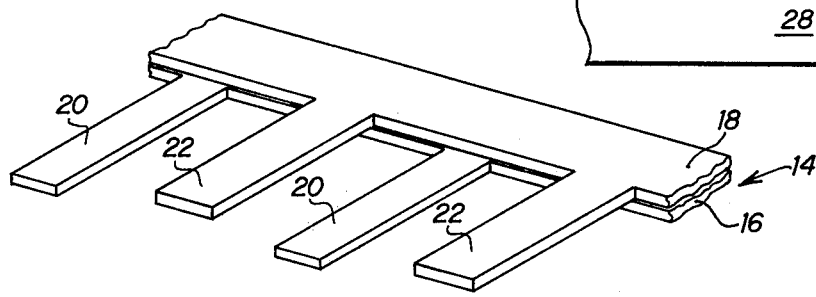
FIG. 6 is a perspective view of the first phase bus and dual layer electrodes of the configuration shown in FIG. 1.

For ease in visualization, FIG. 6 illustrates in perspective the formation of the first phase bus 14 including lower phase bus 16 and upper phase bus 18. The odd numbered phase electrodes 20 extend from the lower level from the phase bus 16, while the even numbered phase electrodes 22 extend from the upper level from the phase bus 18.

Figure 7:
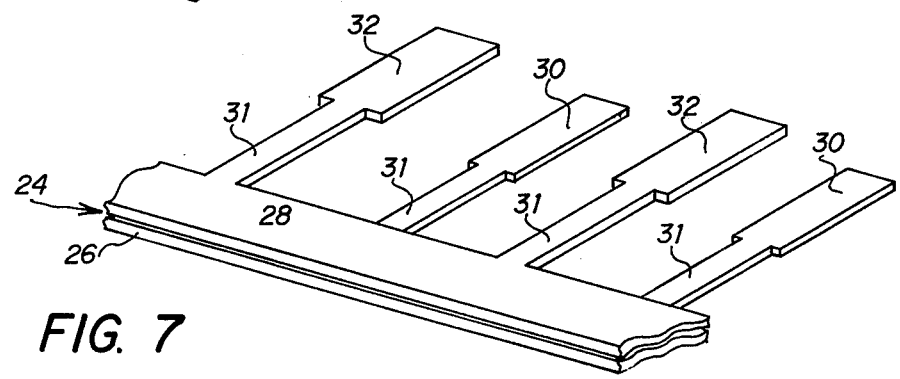
FIG. 7 is a perspective view of the second phase bus and dual layer electrodes of the configuration shown in FIG. 1.

Referring to FIG. 7, the second phase bus 24 is illustrated and may be seen to comprise the lower phase bus 26 and the upper phase bus 28. The odd numbered phase electrodes 32 extend from the upper level, while the even numbered phase electrodes 30 extend from the lower level in the manner illustrated.

Figure 8:
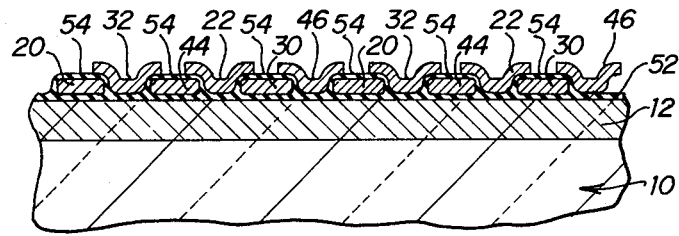
FIG. 8 is a sectional view taken generally along the section lines 2—2 of a second alternate embodiment of the device shown in FIG. 1.

The structure shown in FIGS. 1–7 have been illustrated as occupying two separate and exclusive vertically spaced metallization layers separated by an insulating layer 50. However, the present device may also be fabricated by use of known anodized aluminum fabrication techniques which result in lower surfaces of phase electrodes at the upper layer being disposed at the same plane or level as the lower surfaces of the lower layer electrodes. This configuration is illustrated in FIG. 8, which is a sectional view taken generally along the section lines 2—2 in FIG. 1 when the device is formed according to the anodized aluminum technique. In this embodiment, the semiconductor body and channel 12 are identical to that previously described. Further, the phase busses illustrated in FIG. 1 are identical and the lower level phase electrodes 44 and 30 are formed in the same manner as that previously described.

In this embodiment, the semiconductor body 10 is treated before metallization to form an oxide layer 52. Thereafter, the electrodes 20, 44 and 30 are deposited and formed in the conventional manner thereafter, and oxide layer 54 is formed over the lower layer electrodes. Thereafter, the upper surface is metallized and the zones directly above electrodes 20, 44 and 30 are etched away down to the layer 54 to form electrodes 32, 22 and 46. The third phase bus is also formed in the same manner. As a result, the upper layer electrodes overlap the margins of the lower layer electrodes, and the lower surfaces of the upper layer electrodes are coplanar with the lower surfaces of the lower layer electrodes. Although portions of the electrodes are thus coplanar, the device shown in FIG. 8 is termed a two level electrode configuration according to the invention.

It will thus be seen that the present invention provides an electrode configuration which enables the application of clock pulses to two layered phase electrodes in a CCD register from both sides of the register. This technique requires only one interlevel interconnection per bit in a single register, or one interface interconnection per row of bits in an array of parallel registers. The present technique thus enables three phase clocking of the device with three electrodes per bit, thereby requiring less area than a four phase clocking technique which requires four electrodes per bit. The present technique does not require a large number of interlevel contacts, thereby providing a very compact and easy-to-fabricate configuration.

The present electrode configuration enables the use of three phase CCDs in a two level device instead of four phase CCDs, thereby reducing the required area per bit by 25% for serial arrays and by 44% for serial-parallel-serial (SPS) arrays. The present invention also reduces the number of transfers per bit from four to three, and if register length is limited by charge transfer efficiency, the present invention thus allows serial registers to be 33% longer and SPS arrays to be 78% longer than is possible for four phase systems. This reduced number of transfers is particularly important for analog memory or imager applications, since the signal dispersion due to imperfect transfer cannot be simply removed by use of a threshold detector-regenerator, as in a digital system.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A two level electrode configuration for a three phase charge coupled device having a channel for movement of charge packets comprising:
   a first phase bus extending along one side of the channel and having electronically interconnected upper and lower level portions,
   a dual layered series of first phase electrodes extending from said first phase bus across the channel, with alternate ones of said first electrodes disposed on said upper level and the remainder of said first electrodes disposed on said lower level,
   a second phase bus extending along the other side of the channel and having electrically interconnected portions on said upper and lower levels,
   a dual layered series of second phase electrodes extending from said second phase bus across the channel, with alternate ones of said second electrodes disposed on one level and the remainder of said second electrodes disposed on the other level,
   a third phase bus extending along said other side of the channel and being interleaved over and under alternate ones of said second phase electrodes, and
   a dual layered series of third phase electrodes extending from said third phase bus across the channel with alternate ones of said third electrodes disposed on one level and the remainder of said third electrodes disposed on the other level,
   such that along said channel there is a series of phase electrode sets, each said set comprising a first phase electrode, a second phase electrode, and a third phase electrode, said phase electrodes arranged in the same repeating sequence in each electrode set,
   and insulating means interposed between adjacent ones of said phase electrodes.

2. The two level electrode configuration of claim 1 wherein said first and second phase busses each comprise two interconnected metal strips aligned at said upper and lower levels.

3. The two level electrode configuration of claim 1 wherein phase electrodes on said one level overlap phase electrodes on said other level along margins transverse of the channel.

4. The two level electrode configuration of claim 1 wherein said phase electrodes span more than one charge coupled device channel.

5. The two level electrode configuration of claim 1 and further comprising:
   an insulation layer disposed between said upper and lower levels,
   via holes defined through said insulation layer to accommodate said third phase bus.

6. The two level electrode configuration of claim 5 wherein one via hole is defined per each said electrode set along the channel.

7. The two level electrode configuration of claim 1 wherein said first, second and third phase electrodes all consist of the same metal.

8. The two level electrode configuration of claim 7 wherein said phase electrodes are constructed from aluminum.

9. The two level electrode configuration of claim 8, wherein said phase electrodes on said one level are insulated from said phase electrodes on said other level by a thin surface layer of anodized aluminum formed on the said phase electrodes on the lowermost of said one and said other levels, such that all of said phase electrodes include a coplanar lower surface.

10. The two level electrode configuration of claim 9, wherein said phase electrodes on said one level marginally overlap phase electrodes on said other level.

* * * * *